United States Patent [19]

Hughes et al.

[11] 4,221,458

[45] Sep. 9, 1980

[54] ELECTRICAL CONNECTOR RECEPTACLE

[75] Inventors: Donald W. K. Hughes, Mechanicsburg; Ronald W. Myers, Landisburg, both of Pa.

[73] Assignee: AMP Incorporated, Harrisburg, Pa.

[21] Appl. No.: 940,536

[22] Filed: Sep. 8, 1978

[51] Int. Cl.[3] .......................... H02B 1/04; H05K 1/10

[52] U.S. Cl. .......................... 339/126 R; 339/176 MP

[58] Field of Search ................... 179/1 PC; 339/91 R, 339/176 M, 126 R, 125 R, 17 R, 17 C, 17 LC, 9 B, 99 R, 2 MR, 276 SF

[56] References Cited

U.S. PATENT DOCUMENTS

| | | | |
|---|---|---|---|
| 3,431,545 | 3/1969 | Kirby | 339/217 R X |
| 3,444,329 | 5/1969 | Krumreich | 339/91 R X |
| 4,071,696 | 1/1978 | Anderson | 339/91 R X |

*Primary Examiner*—Roy Lake
*Assistant Examiner*—Eugene F. Desmond
*Attorney, Agent, or Firm*—Frederick W. Raring

[57] ABSTRACT

Electrical connector receptacle comprises an insulating housing having a plug-receiving end and a plug-receiving opening extending into the plug-receiving end. A plurality of stamped and formed conductors are mounted on the housing in side-by-side spaced-apart relationship. Each conductor has a contact spring portion which extends diagonally from the plug-receiving end into the opening from one of the sidewalls of the opening. Each conductor has an intermediate portion which is reversely bent at the plug-receiving end and extends through a channel in an external sidewall towards the rearward end of the housing. The end portion of the conductor extends beyond the housing to permit mounting of the housing on a circuit board with the end portion of the conductor soldered to a conductor on the board. An improved manufacturing method is disclosed in which a plurality of the conductors are simultaneously sheared from a continuous strip, inserted into the side-by-side channels in the external sidewall, and each conductor is formed during assembly to provide the contact springs which extend into the plug-receiving opening.

4 Claims, 14 Drawing Figures

FIG. 8
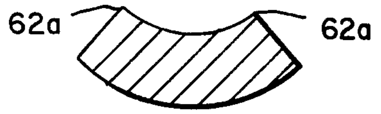
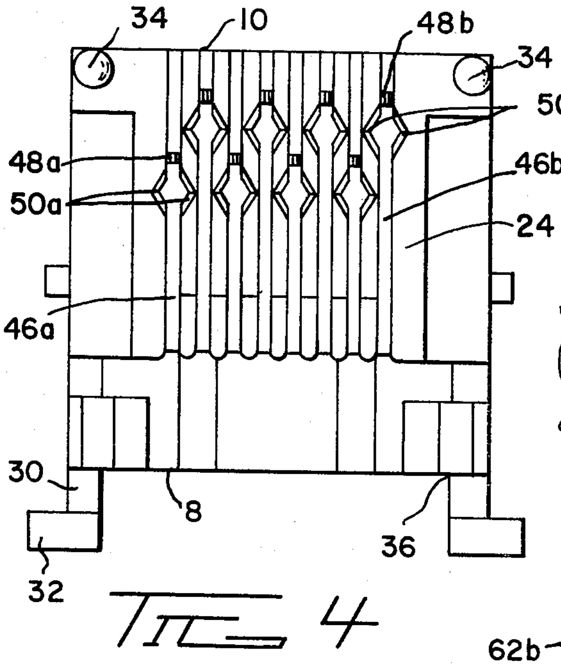
FIG. 4
FIG. 7
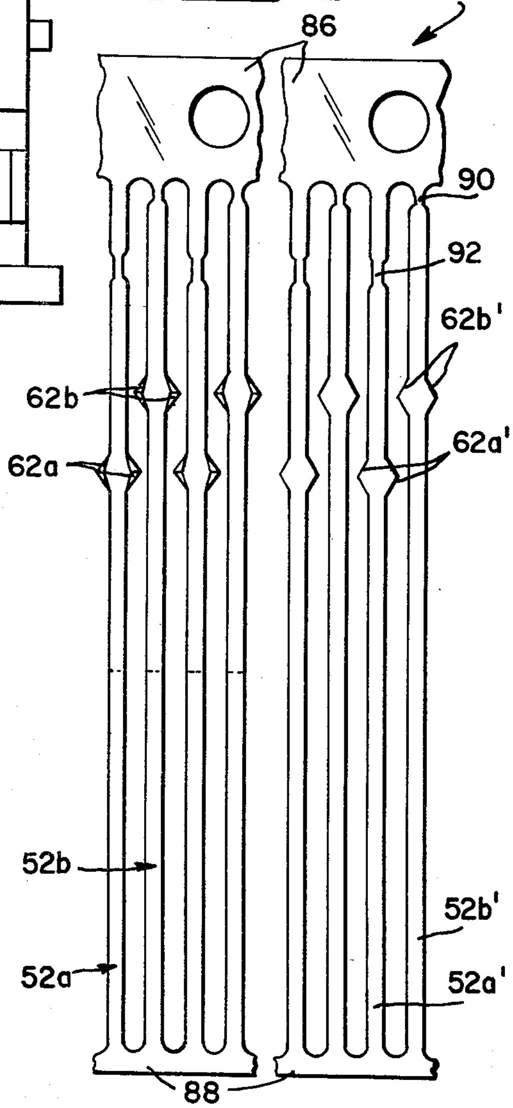
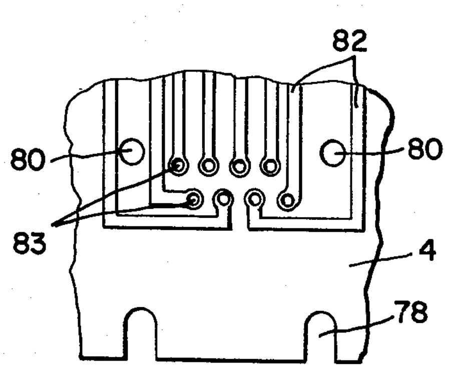
FIG. 5

ELECTRICAL CONNECTOR RECEPTACLE

DESCRIPTION

Field of the Invention

This invention relates to electrical connector receptacles of a type which are intended to receive connecter plugs.

Background of the Invention

U.S. Pat. No. 3,850,497 describes in detail a connector receptacle of a type which is intended for use in the telephone industry. The receptacle described in this patent comprises an insulating housing having a plug-receiving end and a plug-receiving opening extending into the plug-receiving end. A plurality of circular openings extend through the housing from the plug-receiving end to the rearward end of the housing and contact springs extending from these circular openings diagonally into the plug-receiving opening so that when a plug is inserted into the receptacle, the contact members on the plug, will engage the contact springs. The contact springs are in the form of wires and are connected by means of crimped electrical connections to lead wires. These crimped connections are contained in the circular openings in the housing and the lead wires extend from the circular openings and away from the housing at the rearward end thereof. The commonly used type of connector plug which is intended to be mated with connector receptacles of the type described above is described in U.S. Pat. No. 3,954,320.

The connector receptacle described in U.S. Pat. No. 3,850,497 has been widely adopted in the telephone industry and it is being used to an increasing extent on equipment other than telephone equipment, for example, data processing equipment which may be installed adjacent to a telephone exchange, small computers, and similar equipment. The use of these connector receptacles in such related equipment often requires that the receptacle be mounted on a circuit board, but the connector receptacle shown in U.S. Pat. No. 3,850,497 cannot be readily or easily connected to conductors on a circuit board. The present invention, in accordance with the aspect thereof, is directed to the achievement of a connector receptacle capable of being mated with connector plugs of the type shown in U.S. Pat. No. 3,954,320 and which can be mounted on a circuit board with the conductors in the receptacle soldered directly to the conductors on the circuit board.

The wire spring contacts used in connector receptacles of the type shown in U.S. Pat. No. 3,850,497 engage the terminals in a plug connector only along a single line of electrical contact and while this contact arrangement is entirely satisfactory for voice signals, it would be desirable to provide greater contact area in connectors used under other circumstances. The present invention is therefore directed to the achievement of a connector of the general type shown in U.S. Pat. No. 3,850,497 having stamped and formed contact members which provide a substantial area of contact with the terminals of an inserted plug.

The invention is also directed to the achievement of an improved manufacturing method for connectors of the type shown in U.S. Pat. No. 3,850,497 and particularly an improved method of assembling the conductors (spring contacts and adjacent conductors) to the connector housing which avoids the necessity of forming a crimped connection to a contact spring wire.

The herein disclosed embodiment of the invention comprises an insulating housing having a plug-receiving end and a plug-receiving opening extending through the housing from the plug-receiving end to the rearward end. A plurality of side-by-side stamped and formed conductors are mounted on the housing and extend from one of the sidewalls at the plug-receiving end diagonally into the plug-receiving opening. Each conductor extends from the plug-receiving end through a channel in an adjacent external sidewall towards the rearward end of the housing with the end portion of the conductor extending beyond the surface of the housing so that the end can be soldered to conductors on a circuit board. The stamped and formed conductors are produced as a continuous strip in side-by-side spaced-apart relationship. The conductors are assembled to the housing by shearing a plurality of conductors from the strip and moving them laterally of their axes into the channels on the external sidewall of the housing so that portions of each conductor extend beyond the plug-receiving end of the housing. These projecting portions are then reversely bent through an obtuse angle so that they extend diagonally from the plug-receiving end into the plug-receiving opening.

THE DRAWINGS:

FIG. 4 is a plan view of the underside of the connector housing.

FIG. 5 is a plan view of a portion of a circuit board having conductors thereon which extend to openings in the board and which are intended to receive the conductors in a connector receptacle.

FIG. 7 is a plan view of a sheet metal progression showing the manner of manufacturing conductors for the connector receptacle.

FIG.8 is a view taken along the lines 8—8 of FIG. 7.

THE DISCLOSED EMBODIMENT

Figure 1:
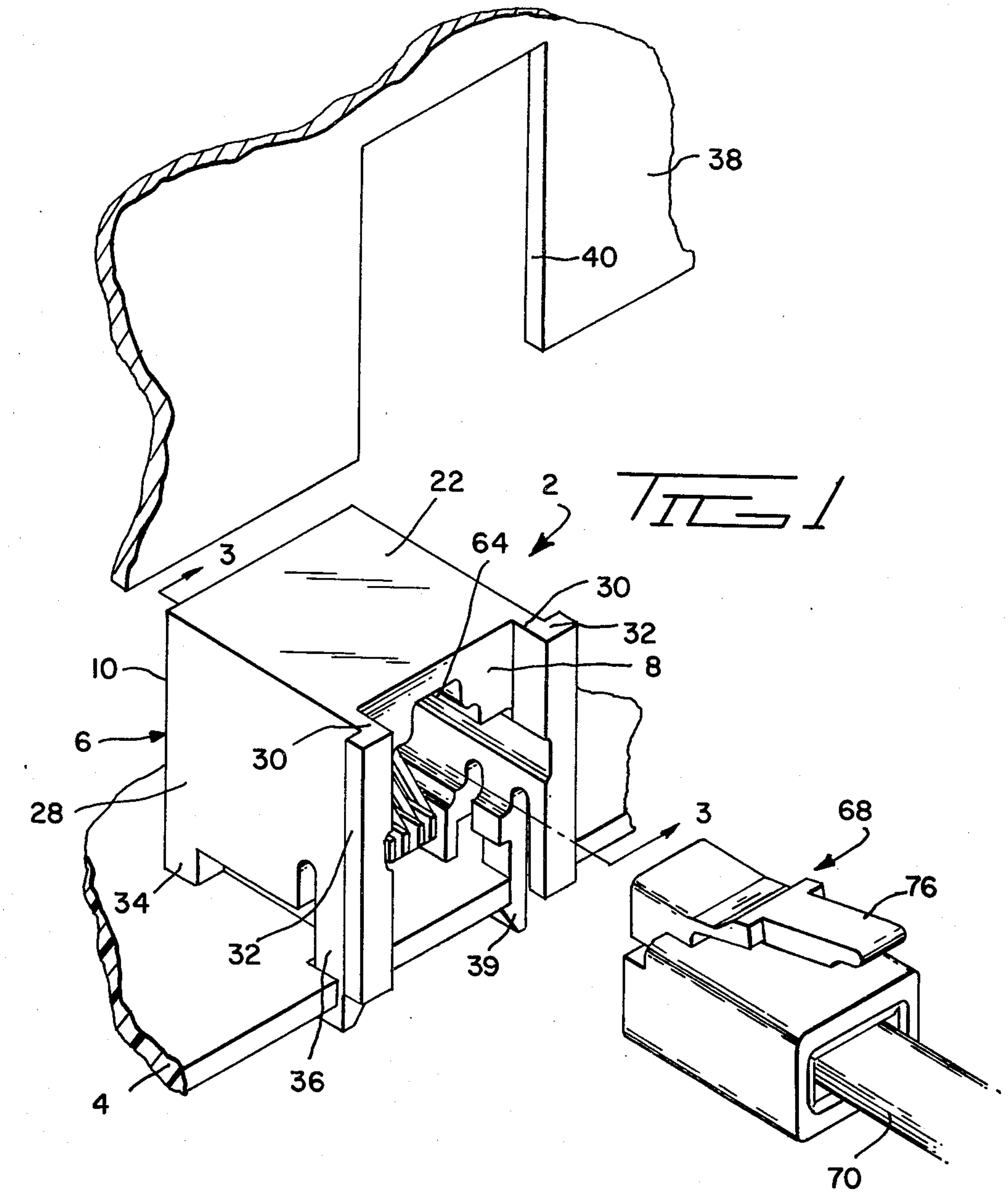
FIG. 1 is a perspective view showing a connector receptacle in accordance with the invention mounted on a circuit board with a complementary connector plug exploded from the receptacle.

FIG. 1 shows a connector receptacle 2 in accordance with the invention mounted on a circuit board 4 and showing a connector plug 68 which is adapted to be mated with receptacle 2. The receptacle comprises an insulating housing 6 having a plug-receiving end 8, a rearward end 10 (FIG. 3), and havinng a plug-receiving opening 12 extending through the housing and between the ends 8, 10. The opening 12 has opposed upper and lower internal sidewalls 14, 16, as viewed in FIG. 3, and opposed internal endwalls 18, 20. The housing has external sidewalls 22, 24 and external endwalls 26, 28 which are adjacent to the internal sidewalls 14, 16 and the internal endwalls 18, 20 respectively. The endwalls 26, 28 have projecting portions 30 which extend beyond the plug-receiving end 8 and outwardly projecting flanges 32 are provided on the ends of these extensions. The housing 6 is mounted on the circuit board 4 by means of integral locating pins 34 adjacent to the rearward end 10 of the housing which are received in circular openings 80 in the circuit board and by latch arms 36 having enlarged ends 39 which are received in notches 78 at the edge of the circuit board. If desired, a cover panel 38 may be provided having a shaped opening 40 which receives the housing 6 when the panel is moved downwardly from the position of FIG. 1. It will be apparent that the flanges 32 will then extend laterally beyond the edges of the opening 40 and support the housing against movement parallel to the surface of the circuit board 4.

A plurality of spaced-apart recesses 42 are provided in the mating or plug-receiving end between the internal and external sidewalls 16, 24 and each recess merges with a slot 44 which extends partially along the sidewall 16. Each recess 42 also communicates with a relatively narrow channel 46*a* or 46*b* in the external sidewall 24. Each channel has an inner end 48*a* or 48*b* and the opposed sides of each channel have V-shaped recesses 50*a*, and 50*b*. It will be noted that the ends 48*a* of the channels 46*a* in FIG. 4 are comparatively remote from the rearward end 10 of the housing and that the recesses 50*a* are adjacent to the ends 48*a*. The ends of the channels 46*b* are proximate to the rearward end 10 of the housing and the recesses 50*b* are immediately adjacent to the ends of these channels so that the recesses 50*a*, 50*b* and the ends 48*a*, 48*b* of the channels are staggered with respect to the rearward end 10 of the housing.

Figure 2:
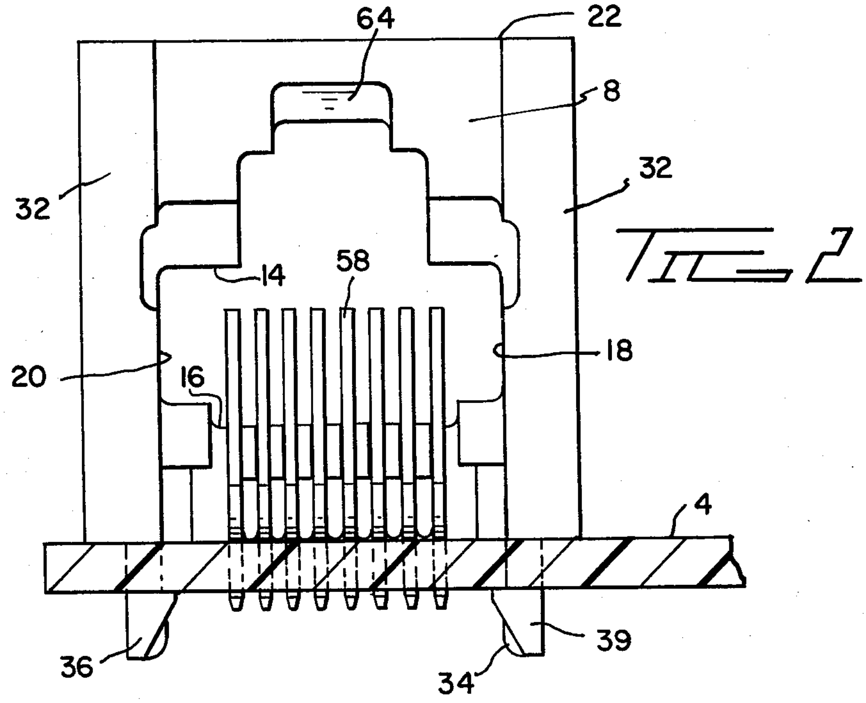
FIG. 2 is a frontal view of the connector of FIG. 1.
Figure 3:
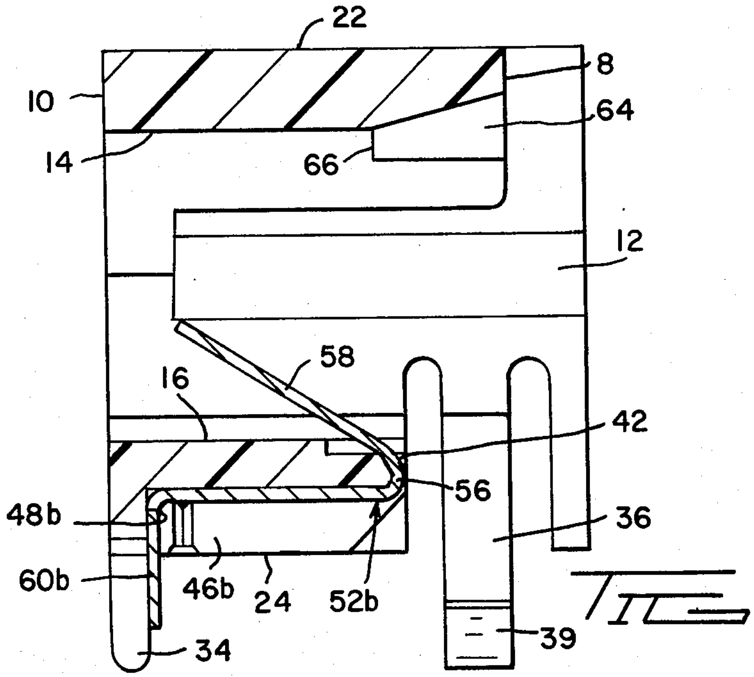
FIG. 3 is a cross-sectional view taken along the lines 3—3 of FIG. 1, but with the circuit board omitted.

A plurality of stamped and formed conductors 52*a* and 52 *b* are mounted in the housing as shown in FIG. 3, each conductor having intermediate portion 54*a*, 54*b* which is located in one of the channels 46*a*, 46*b*, a reverse bend 56 adjacent to the plug-receiving end of the housing, and a first end portion 58 which serves as a contact spring and which extends diagonally into the plug-receiving opening 12. It will be apparent that the recess 44 will permit the spring member 58 of each conductor to flex downwardly from the position of FIG. 3 when the plug is inserted. A second end portion 60*a*, 60*b* of each conductor extends normally of the intermediate 54*a*, 54*b* and downwardly, as viewed in FIG. 3, beyond the lower sidewall 24. These second ends are dimensioned to be inserted into the staggered circuit board holes 83, FIG. 5, and soldered to conductors on the underside of the board, as shown in FIG. 2. Each conductor has outwardly extending barbs 62*a*, 62*b* which are received in the recesses 50*a* and 50*b* respectively, and which are dimensioned to have a force fit in the recesses thereby to retain the conductors in the housing.

Figure 6:
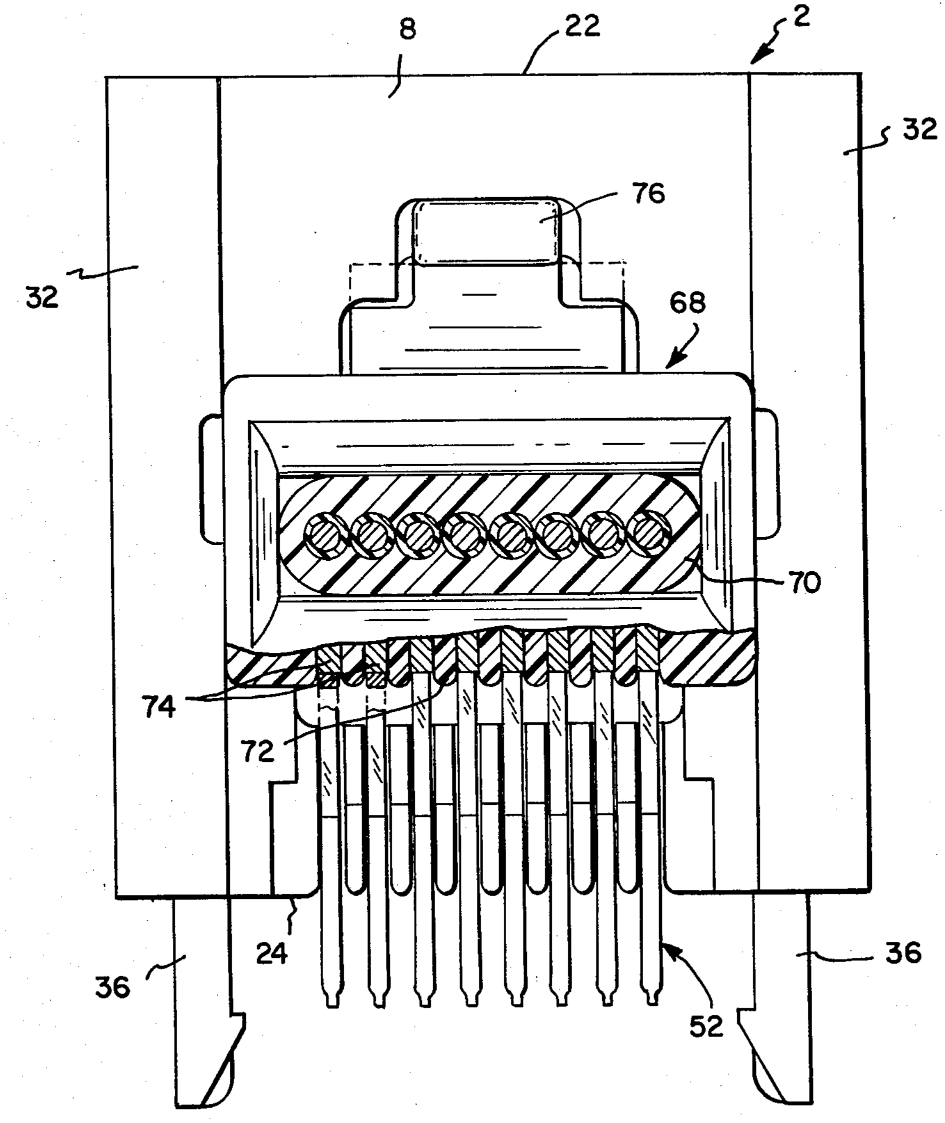
FIG. 6 is a frontal view of a connector receptacle having a connector plug inserted into the plug-receiving opening.

The plug member 68 is described in detail in the above identified U.S. Pat. No. 3,954,320. This plug member comprises an insulating housing having recess therein which receives the end portion of cable 70 having plurality of wires therein. The wires are connected by means of insulation piercing connections to blade-like terminals contained in the housing, the edges of which are adjacent to the underside of the housing 72 as shown at 74. The edges of these blades thus engage the surfaces of the spring contacts 58 when the plug is inserted into the receptacle, as shown in FIG. 6. The plug is retained in the receptacle by means of a latch arm 76 which extends from the upper surface of the plug housing and which has shoulders for engagement with shoulders 66 on each of the end shoulders 12, 14 adjacent to the internal sidewall 14. The plug-receiving opening is enlarged as shown at 64 for the accommodation of this latch arm.

The conductors 52*a* and 52*b* are manufactured by a continuous strip of suitable sheet metal such as brass or beryllium copper, as shown in FIG. 7. The stamped conductors are integral with spaced apart carrier strips 86, 88 and each conductor comprises a simple metal strip extending between the carrier strips having outwardly projecting barbs 62*a*' and 62*b*', as shown. The barbs 62*a*' are relatively adjacent to the carrier strip 86 while the barbs or lances 62*b*' are somewhat further removed from this carrier strip. The conductors 52*b*' are connected to the carrier strip 86 by neck portions 90 which are immediately adjacent to the carrier strip while the conductors 52*a* have neck portions 92 which are spaced from the carrier strip. As will be explained below, the individual conductors are sheared from the strip at these neck portions and the staggered relationship of the neck portions and the barbs or lances in the flat strip of FIG. 7 produces conductors having the formed lances 60 properly spaced for reception in the staggered recesses in the housing. The barbs 62*a* and 62*b* are formed upwardly very slightly, as shown in FIG. 8, to facilitate the engagement of these barbs with the surfaces of the recesses in the channels. This forming operation is the only one required in the manufacture of the strip of conductors.

Figure 10:
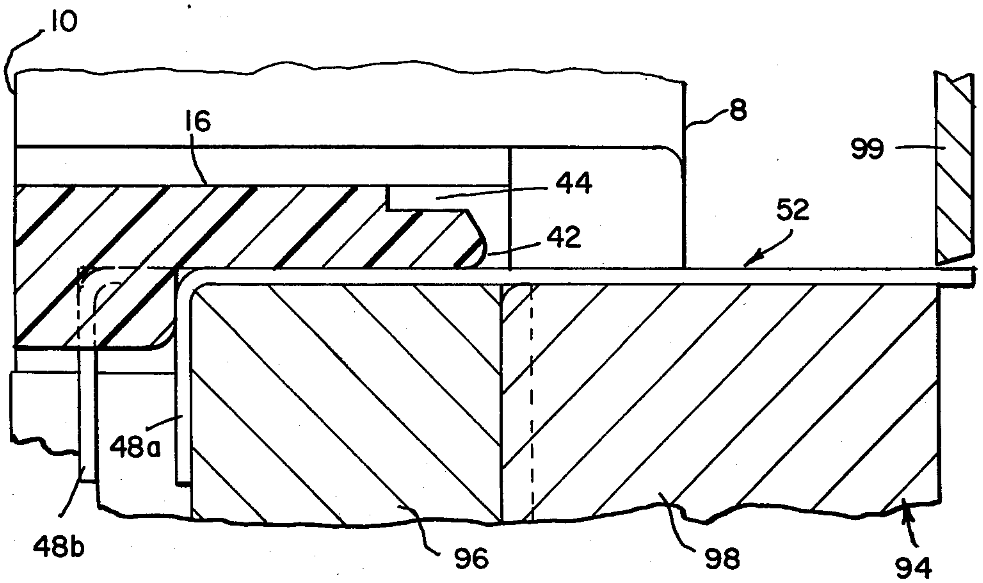
FIGS. 10 and 11 are views similar to FIG. 9 but showing the positions of the parts of the tooling at successive stages of the inserting and forming operation.
Figure 11:
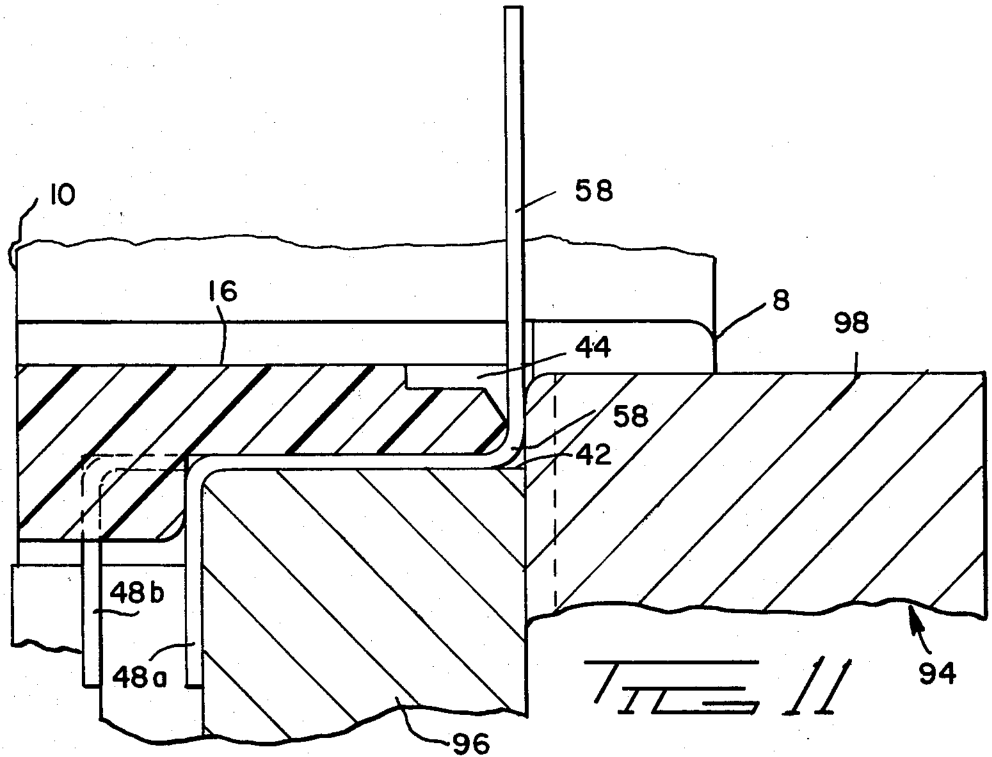
Figure 12:
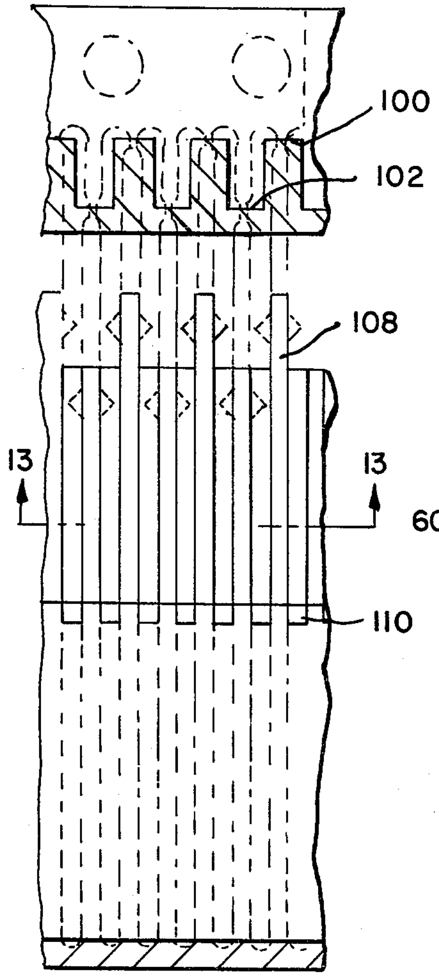
FIG. 12 is a plan view of the tooling of FIGS. 9–11.
Figure 13:
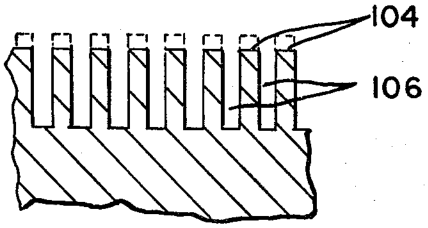
FIG. 13 is a view taken along the lines 13—13 of FIG. 12.

The stamped and formed conductors 52*a*, 52*b* can be assembled to the receptacle housing by the tooling and in the manner illustrated in FIGS. 9–13. The insertion tooling comprises a fixed shearing member 90, a movable shearing blade 92, an insertion and forming ram assembly 94 which comprises two ram parts 96, 98, and an additional shearing member or shearing blade 99. The shearing members 90, 92 sever the conductors 52*a*, 52*b* from the carrier strip 86 and, as shown in FIG. 12, the shearing edges 100, 102 are offset from each other so that the conductors 52*a* will be sheared from the strip at the neck portion 92 (FIG. 7) and the conductors 52*b* will be severed at the neck portion 90.

The ram part 96 has spaced-apart support surfaces 104 for the conductors and recesses 106 on each side of each support surface to permit the support surfaces to insert the conductors into the channels on the underside of the housing, the barriers between adjacent channels being received in the recesses 106. As shown in FIG. 12, the support surfaces for the conductors 52*b* extend beyond the support surfaces for the conductors 52*a* for the reason that the channels 46*b* are longer than the channels 46*a* in the housing. The surface 112 of the ram part 98 is coplanar with the surfaces of the support surfaces 104 when the parts are in the positions of FIG. 9 however, spaced-apart openings 110 extend vertically through the ram part 98 between adjacent conductors as shown in FIG. 12. These recesses provide clearance for the barriers between adjacent recesses 42 in the housing when the conductors are inserted as described below.

Figure 9:
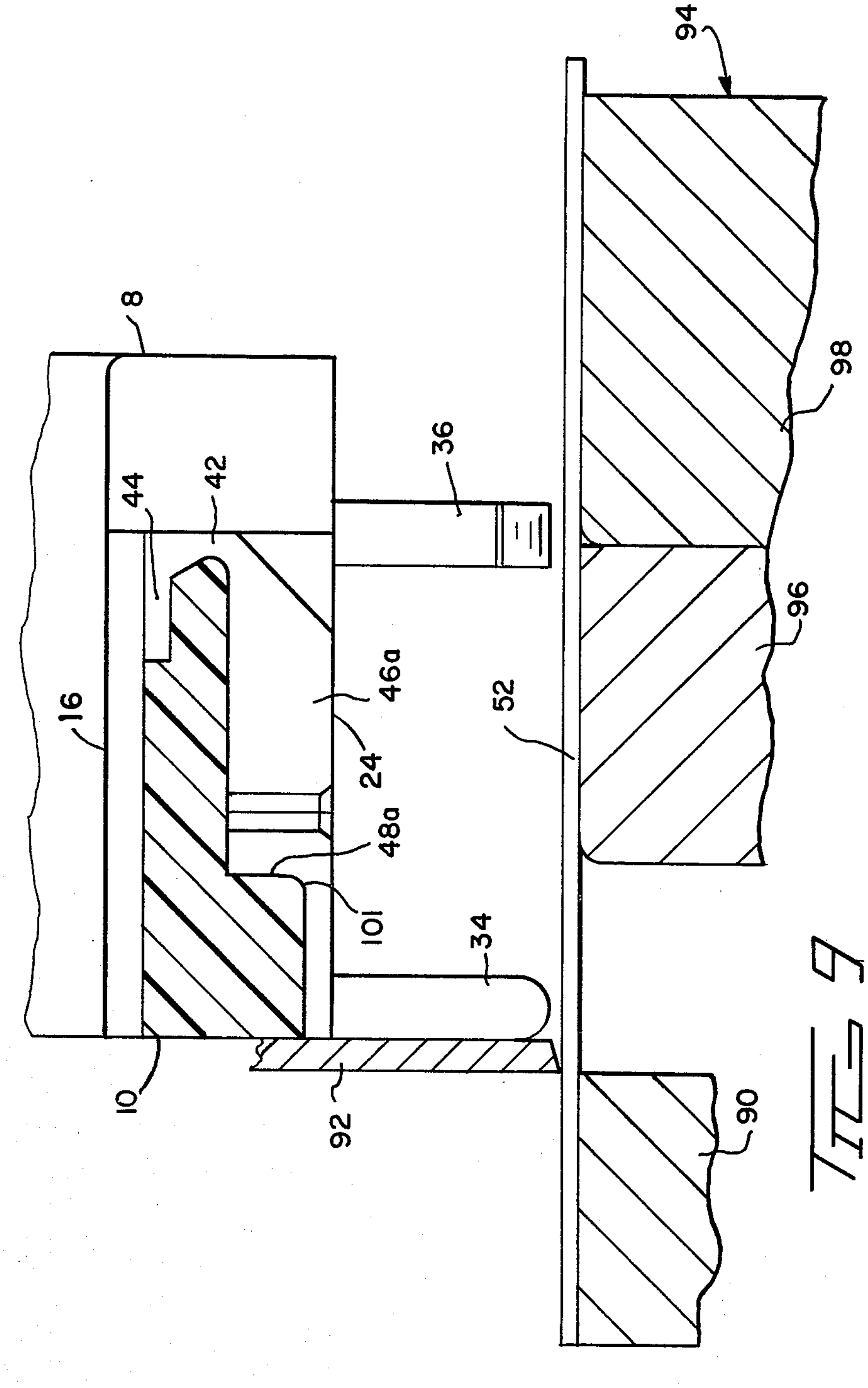
FIG. 9 is a fragmentary cross-sectional side view showing insertion and forming tooling for inserting the conductors of FIG. 7 into the channels in the underside of the connector housing.

The required numberr of conductors for the housing are assembled to the housing by positioning a section of strip 84 on the tooling as shown in FIG. 9, with the housing supported above the tooling and with the conductors in alignment with the channels 46*a*, 46b. During insertion, the movable shearing blade 92 first moves downwardly from the position of FIG. 9 to sever the conductors from the carrier strip 86. The conductors may be held on the ram assembly 94 by the shearing blade 99 or by other suitable holddown means. The shearing blade 92 then moves upwardly from the position of FIG. 9 and the ram assembly 94 moves upwardly to the position of FIG. 10 as a unit. During such movement, the second end portions 60 of the conductors are bent normally of the intermediate portions 54*a* and 54*b* of the conductors when the conductors are pushed past the corners indicated at 101 in the channels. After the conductors have been inserted into the channels, as shown in FIG. 10, the shearing blade 100 moves downwardly from the position of FIG. 10 and in cooperation with the right hand edge of the ram block 98 shears the narrow carrier strip 88 from the conductors. The ram part 98 moves upwardly while the ram part 96 remains stationary and at the conclusion of this upward stroke of ram part 98, the contact spring portions of the conductors will extend vertically upwardly, as shown in FIG. 11, from the intermediate portions 54*a* and 54*b*. The housing can then be removed from the tooling and the contact portions 58 of the conductors bent inwardly to their final positions as shown in FIG. 3 This final forming operation can be carried out by inserting a suitable gaging tool into the plug-receiving opening of the housing.

Figure 14:
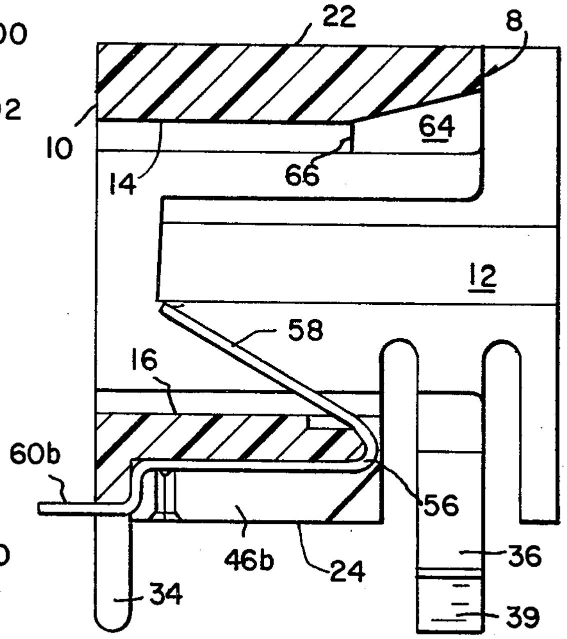
FIG. 14 is a sectional side view of an alternative embodiment of the invention.

FIG. 14 shows an alternative embodiment of the invention in which the ends of the conductors extend through shallow extensions of the channels 46*a*, 46*b* and beyond the rearward face or rearward end of the connector housing. This embodiment is intended to be mounted on a circuit board with the rearward end 10 on the surface of the board. If desired, the projecting ends can be offset from each other to permit the ends to be inserted into circuit board holes arranged in the pattern of FIG. 5.

It will be apparent from the foregoing that a connector is provided in accordance with the principles of the invention which can be readily mounted on the circuit board and soldered to the conductors on the board without the necessity of intervening connecting devices or conductors. The second ends of the conductors which project beyond the downwardly facing sidewall or the rearward end of the housing can be connected to further conductors by other means, if desired. For example, these ends can be shaped or formed such that they can be mated with terminal receptacles crimped onto the end of wires or they can be formed with wire-receiving slots of the type which receive an insulated wire upon movement of the wire laterally of its axis and into the slot. Connector receptacles having tab type ends on the conductors can be mated directly with a complementary connector having receptacles thereon which receive the tabs. It will thus be apparent that the possible field of use is extremely wide and connector plugs of the type described in U.S. Pat. No. 3,954,320 can therefore also be used in the same circumstances.

The fact that the conductors in the housing are stamped and formed and have a substantial width, as illustrated in FIG. 6, gives rise to improved electrical characteristics in that the edges of the terminals in the plug are always against a flat surface of the contact members or conductors in the receptacle. It will be apparent from FIG. 6 that slight misalignment of the terminals in the plug member relative to the contact springs will not affect the quality of the electrical connections which will always consist of two flat surfaces disposed against each other.

Finally, it is advantageous that connectors in accordance with the invention can be produced by injection molding a one-piece housing, stamping the individual conductors, and inserting all of the conductors required for the housing in a single insertion operation. The simplicity of the connector thus results in substantial economies in production.

We claim:

1. An electrical connector receptacle of the type comprising an insulating housing having a plug-receiving end and a rearward end, a plug-receiving opening extending into said plug-receiving end, said opening having opposed internal sidewalls and opposed internal endwalls, said housing having oppositely directed external sidewalls and oppositely directed external endwalls, a plurality of electrical conductors in side-by-side spaced-apart relationship, each of said conductors comprising a contact spring portion extending from one of said internal sidewalls at a location adjacent to said plug-receiving end diagonally into said opening and towards the opposite sidewall, and each conductor having a lead portion extending from said plug-receiving end through said housing between said one internal sidewall and the adjacent external sidewall and towards said rearward end, said plug-receiving opening being dimensioned to receive a connector plug having spaced-apart contact members therein which engage said contact spring portions of said conductors, said connector receptacle being characterized in that:

said adjacent external sidewall has a plurality of side-by-side channels therein extending from said plug-receiving end towards said rearward end, each of said conductors comprises a single elongated strip of stamped and formed sheet metal, an intermediate section of each conductor being disposed in one of said channels, each conductor being reversely bent at said plug-receiving end and having a first end portion extending into said plug-receiving opening, a second end portion of each conductor extending beyond said housing, said first end portion constituting said contact spring portion, said intermediate portion and said second end portion constituting said lead portions, interengaging means effective between each of said conductors and said housing for maintaining said conductors in assembled relationship to said housing, said housing having integral mounting and supporting means extending from said adjacent external sidewall for mounting said connector on a panel-like member with said adjacent external sidewall against said panel-like member, said second end portions of said conductors extending laterally of said housing and away from said adjacent external sidewall, said second end portions of said conductors being intended for insertion into holes in said panel-like member.

2. An electrical connector as set forth in claim 1, said interengaging means comprising barbs on said intermediate portion of each of said conductors, said barbs extending into surface portions of said channels.

3. An electrical connector as set forth in claim 2, said barbs on each conductor being offset with respect to said barbs on adjacent conductors in the direction extending from said plug-receiving end to said rearward end.

4. An electrical connector receptacle of the type comprising an insulating housing having a plug-receiving end and a rearward end, a plug-receiving opening extending into said plug-receiving end, said opening having opposed internal sidewalls and opposed internal endwalls, said housing having oppositely directed external sidewalls and oppositely directed external endwalls, a plurality of electrical conductors in side-by-side spaced-apart relationship, each of said conductors comprising a contact spring portion extending from one of said internal sidewalls at a location adjacent to said plug-receiving end diagonally into said opening and towards the opposite sidewall, and each conductor having a lead portion extending from said plug-receiving end through said housing between said one internal sidewall and the adjacent external sidewall and towards said rearward end, said plug-receiving opening being dimensioned to receive a connector plug having spaced-apart contact members therein which engage said contact spring portions of said conductors, said connector receptacle being characterized in that:

said adjacent external sidewall has a plurality of side-by-side channels therein extending from said plug-receiving end towards said rearward end, each of said conductors comprises a single elongated strip of stamped and formed sheet metal, an intermediate section of each conductor being disposed in one of said channels, each conductor being reversely bent at said plug-receiving end and having a first end portion extending into said plug-receiving opening, a second end portion of each conductor extending beyond said housing, said first end portion constituting said contact spring portion, said intermediate portion and said second end portion constituting said lead portions, interengaging means effective between each of said conductors and said housing for maintaining said conductors in assembled relationship to said housing, said connector being intended for mounting on a panel-like member with said rearward end against said panel-like member, said second end portions of said conductors extending past and beyond said rearward end and being intended for insertion into openings in said panel-like member, and, said housing having integral mounting and supporting means for supporting said housing.

* * * * *